US007019409B2

(12) United States Patent
Nakano et al.

(10) Patent No.: US 7,019,409 B2

(45) Date of Patent: Mar. 28, 2006

(54) CIRCUIT DEVICE

(75) Inventors: Atsushi Nakano, Gunma (JP); Atsushi Kato, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/948,066

(22) Filed: Sep. 23, 2004

(65) Prior Publication Data

US 2005/0087857 A1 Apr. 28, 2005

(30) Foreign Application Priority Data

Sep. 30, 2003 (JP) ........................ P. 2003-342081

(51) Int. Cl.
*H01L 23/06* (2006.01)
*H01L 23/48* (2006.01)
*H01L 23/52* (2006.01)
*H01L 29/40* (2006.01)

(52) U.S. Cl. ...................... 257/778; 257/784; 257/738; 257/684

(58) Field of Classification Search ........ 257/777–796, 257/737, 738, 684
See application file for complete search history.

(56) References Cited

U.S. PATENT DOCUMENTS 6,498,392 B1 * 12/2002 Azuma ...................... 257/676

FOREIGN PATENT DOCUMENTS

JP 11-340257 12/1999

* cited by examiner

*Primary Examiner*—Cuong Nguyen
(74) *Attorney, Agent, or Firm*—Fish & Richardson P.C.

(57) ABSTRACT

Provided is a circuit device which achieves an increased stickiness between a circuit element and other constituent components. A circuit device comprises a conductive pattern, a covering resin covering the conductive pattern except for a first opening portion, and a semiconductor element electrically connected to the conductive pattern exposed from the first opening portion through a conductive paste. A size of the first opening portion is smaller than that of the semiconductor element, and the conductive paste comes into contact with both of the covering resin and the conductive pattern exposed from the first opening portion.

6 Claims, 8 Drawing Sheets

CIRCUIT DEVICE

BACKGROUND OF THE INVENTION

Priority is claimed to Japanese Patent Application Number JP2003-342081 filed on Sep. 30, 2003, the disclosure of which is incorporated herein by reference in its entirety.

1. Field of the Invention

The present invention relates to a circuit device, and particularly to a circuit device achieving an increased stickiness between a circuit element and other constituent components.

2. Descriptions of the Related Arts

A constitution of a conventional semiconductor device 100 will be described with reference to FIGS. 9A and 9B. FIG. 9A is a plan view of the semiconductor device 100, and FIG. 9B is a section view thereof (see Patent Document 1).

When referring to FIG. 9A, a land 102 made of a conductive material is formed at the central portion of the semiconductor device 100, and one end of each of a plurality of leads 101 is made close to the periphery of the land 102. The one end of each of the plurality of leads 101 is electrically connected to a semiconductor element 104 by a thin metal wire 105, and the other end thereof is exposed from a sealing resin 103. The sealing resin 103 has a function to seal the semiconductor element 104, the land 102 and the leads 101 and to support them collectively. Patent Document 1 Japanese Patent Laid-Open Hei 11 (1999-340257

However, in the above described circuit device, the semiconductor element 104 is mounted on a surface of the land 102 which a plating film is formed on its surface. When the semiconductor element 104 is mounted on the land 102 with adhesive showing low stickiness such as silver paste, which is interposed therebetween, stickiness between the semiconductor element 104 and the land 102 is insufficient thus causing problem of contact failure. There is also a problem that the adhesive adhering the semiconductor element 104 and the land 102 to each other may flow out from the land 102.

SUMMARY OF THE INVENTION

The embodiment of the present invention was made in view of the above described problems, and a principal object of the present invention is to provide a circuit device which achieves an increased stickiness between a circuit element and other constituent components.

The present invention is a circuit device comprising: a conductive pattern; a covering resin for covering the conductive pattern except for an opening portion; and a semiconductor element electrically connected to the conductive pattern exposed from the opening portion through conductive paste, wherein the opening portion is formed to be smaller than the semiconductor element, and the conductive paste comes into contact with both of the covering resin and the conductive pattern exposed from the opening portion.

In the preferred embodiments, the conductive paste is silver paste.

In the preferred embodiments, a plating film is formed on a surface of the conductive pattern exposed from the opening portion.

In the preferred embodiments, the opening portion is formed along a middle portion of each side of the semiconductor element, and each corner portion of the semiconductor element is adhered to the covering resin through the conductive paste.

In the preferred embodiments, sealing resin is formed so as to seal the semiconductor element.

In the preferred embodiments, the conductive pattern has a wiring structure composed of a plurality of layers.

According to the circuit device of the embodiment of the present invention, the conductive paste adhering the semiconductor element to the covering resin comes into contact with both of the conductive pattern and the covering resin covering the conductive pattern, whereby stickiness between the semiconductor element and the conductive pattern with the covering resin interposed therebetween can be increased. Furthermore, an excessive spread of the conductive paste can be suppressed by providing the opening portion of the covering resin, from which the conductive pattern is exposed, along the middle portion of each side of the semiconductor element.

DETAILED DESCRIPTION OF THE PREFERRED EMBODIMENTS

Figure 1A:
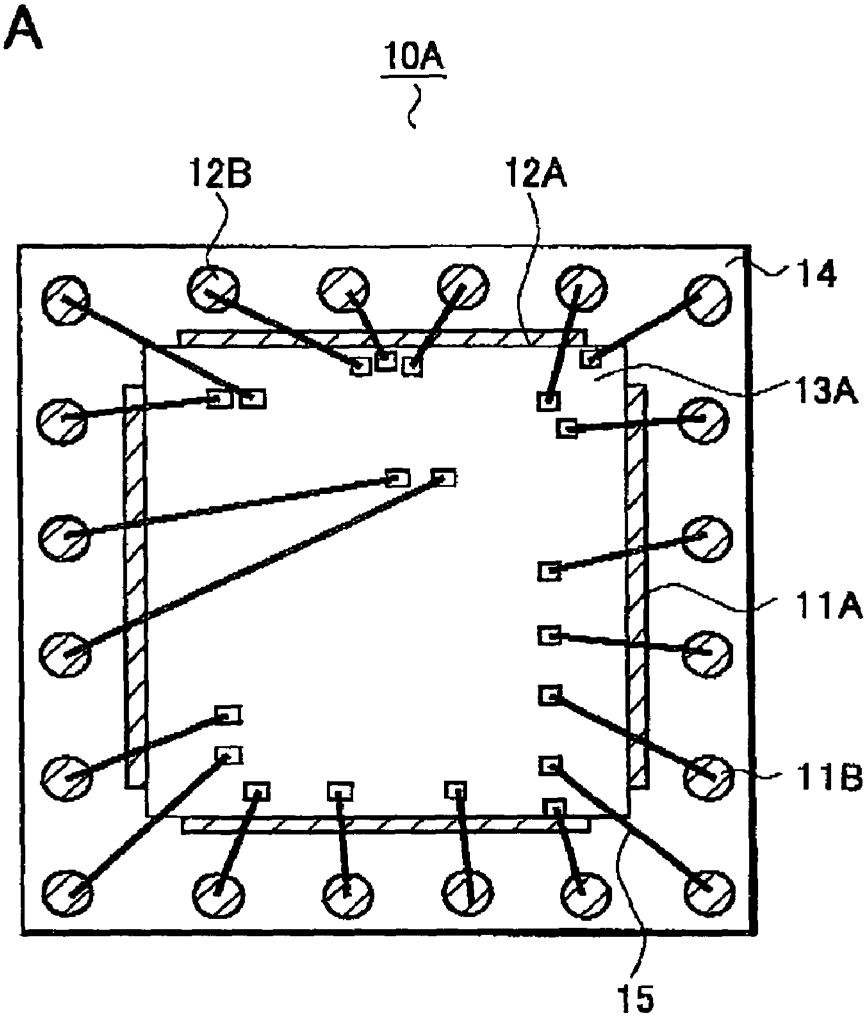
FIG. 1A is a plan view showing a circuit device of the preferred embodiment.

A constitution of a circuit device 10A of this embodiment will be described with reference to FIGS. 1A and 1B. FIG. 1A is a plan view of the circuit device 10A, and FIG. 1B is a section view thereof.

Referring to FIG. 1A, the circuit device 10A is a package in which a semiconductor element 13A is resin-sealed by a sealing resin 18. Furthermore, a multi-layered wiring including first and second wiring layers 20 and 21 is formed. Herein, the first wiring layer 20 includes first and second conductive patterns 12A and 12B. Details of each component and a constitution relating thereto will be described below.

Figure 1B:
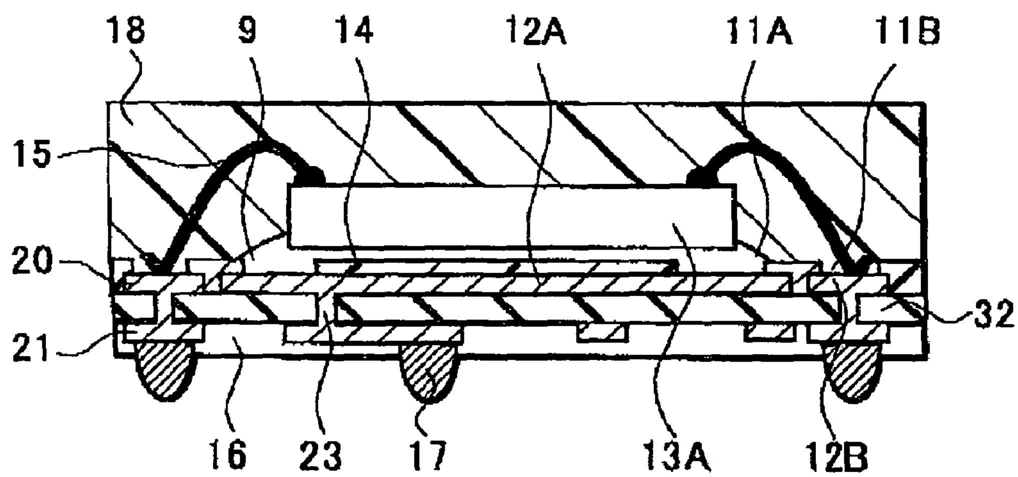
FIG. 1B is a section view showing the circuit device of the preferred embodiment.

Referring to FIG. 1B, a multi-layered wiring structure including the first and second wiring layers 20 and 21 is constituted. Furthermore, a multi-layered wiring structure including three layers or more may be adopted. The above described first and second conductive patterns 12A and 12B are formed in the first wiring layer 20. Note that a wiring portion for connecting the first and second conductive patterns 12A and 12B may be formed. The second wiring layer 21 forms a pad portion for adhering an external electrode thereto. A wiring portion for allowing electric circuits to intersect each other may be formed in the second wiring layer 21. The first and second wiring layers 20 and 21 are laminated with an insulating layer 32 made of resin interposed therebetween, and electrically connected to each other by a connection portion 23 at desired points.

The first conductive pattern 12A is provided below the semiconductor element. The planar size of the first conductive pattern 12A may be larger than the semiconductor element 13A so as to be land-shaped. The surface of the first conductive pattern 12A is covered by a covering resin 14, and partially exposed from a first opening portion 11A. The exposed part of the first conductive pattern 12A is electrically connected to a rear surface of the semiconductor element with a conductive paste 9 interposed therebetween. Furthermore, the first conductive pattern 12A may be connected to the second wiring layer 21, which is a lower layer, through the connection portion 23. In addition, the first conductive pattern 12A may be electrically connected to a mounting board or the like, which mounts the circuit device, through an external electrode 17.

The second conductive pattern 12B is disposed so as to surround the above described land-shaped first conductive pattern 12A. The surface of the second conductive pattern 12B is exposed from a second opening portion 11B provided in the covering resin 14. The second conductive pattern 12B is electrically connected to the semiconductor element 13A through a thin metal wire 15.

As a circuit element 13, the semiconductor element 13A is herein adopted. An active element such as an LSI chip, a bare transistor chip, and a diode can be adopted as the circuit element 13. Furthermore, a passive element such as a chip resistor, a chip capacitor, and an inductor can be also adopted as the circuit element 13. The plurality of circuit elements 13 can be also incorporated in the circuit device to be electrically connected to each other internally. Rear surface of the semiconductor element 13A is die bonded to the conductive pattern 12 with the conductive paste 9. An electrode formed on a front surface of the semiconductor element 13A and the second conductive pattern 12B are electrically connected to each other through the thin metal wire 15. The semiconductor element 13A can be also connected thereto face down. In the case of a chip element, electrodes of both ends thereof are die bonded to the conductive pattern 12 with a brazing material such as soft solder.

The sealing resin 18 is made of thermoplastic resin formed by an injection mold or made of thermosetting resin formed by a transfer mold. The sealing resin 18 has a function to seal the whole circuit device, as well as to mechanically support the whole circuit device.

The second wiring layer 21 is covered by a resist 16 made of resin. An external electrode 17 made of a brazing material such as soft solder is formed on a surface of the second wiring layer 21 exposed from the opening portion provided in the resist 16.

The first opening portion 11A is a region produced by partially removing the covering resin 14 covering the first conductive pattern 12A, and the first conductive pattern 12A is partially exposed from this region. The second opening portion 11B is a region produced by partially removing the covering resin 14 covering the second conductive pattern 12B. As described above, the portion of the conductive pattern 12 electrically connected to the circuit element 13 is exposed from the opening portion. Concrete constitutions of the opening portions will be described with reference to FIG. 2 in detail. A plating film is formed on the portion of the surface of the conductive pattern 12, which is exposed from the opening portion. Herein, a plating film made of silver or gold can be adopted as the plating film.

A constitution describing a relation between the semiconductor element 13A and the first conductive pattern 12A will be described. The semiconductor element 13A is die bonded to the surface of the covering resin 14 by use of the conductive paste 9 such as silver paste. Herein, the first opening portion 11A is formed in a region where the semiconductor element 13A is to be mounted, and a planar size of the first opening portion 11A is smaller than that of the semiconductor element 13A. The conductive paste 9 is attached to the entire of the rear surface of the semiconductor element 13A. Accordingly, the conductive paste 9 comes into contact with both of the covering resin 14 and the surface of the first conductive pattern 12A exposed from the first opening portion 11A.

It is possible to electrically connect the rear surface of the semiconductor element 13A and the first conductive pattern 12A by allowing the conductive paste 9 to come into contact with the surface of the first conductive pattern 11A. Therefore, when the semiconductor element 13A is an IC, the rear surface of the semiconductor element 13A and the ground potential can be connected with each other. Furthermore, it is also possible to make electrical contact between a rear surface of the semiconductor element 13A, through which an electrical signal other than a ground potential passes, and the first conductive pattern 12A.

Furthermore, it is possible to increase a fixation strength of the semiconductor element 13A by allowing the conductive paste 9 to come into contact with the covering resin 14. As described above, the plating film is formed on the surface of the first conductive pattern 12A exposed from the first opening portion 11A. For this reason, an attachment strength between the plating film and the conductive paste 9 is very weak. Accordingly, the conductive paste 9 is also allowed to come into contact with the covering resin 14 in the circuit device of the embodiment, whereby a coupling strength of the semiconductor element 13A is secured. Since an adhesion strength between the covering resin 14 and the conductive paste 9 containing a resin component is high, it is possible to increase the bond strength of the semiconductor element 13A.

Figure 2A:
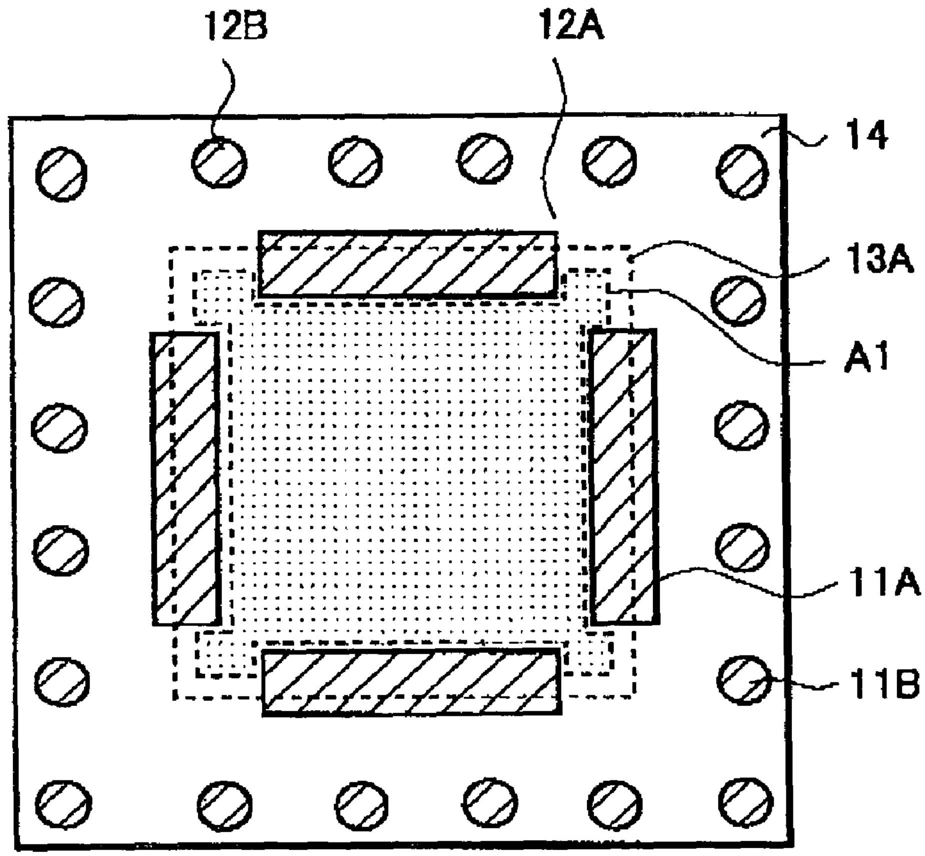
FIG. 2A is a plan view showing a circuit device of the preferred embodiment.
Figure 2B:
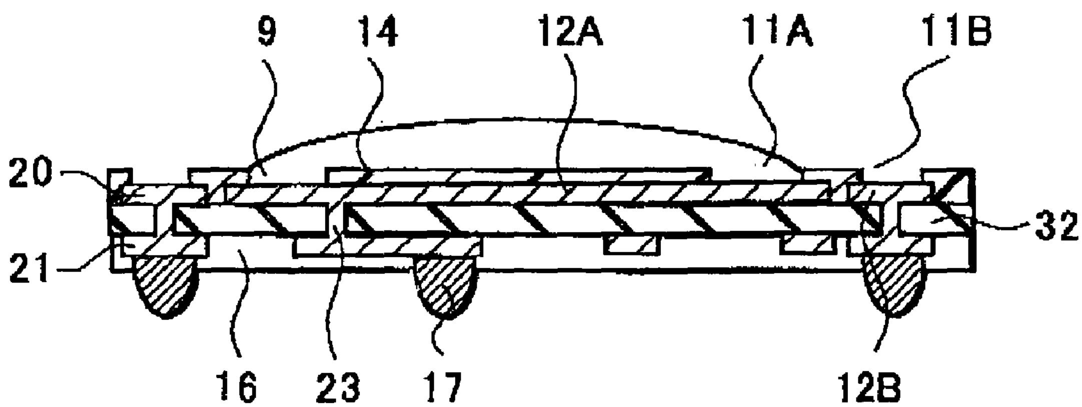
FIG. 2B is a section view showing the circuit device of the preferred embodiment.

Referring to FIGS. 2A and 2B, descriptions centering on a concrete constitution of the first opening portion 11A will be made. In a plan view of FIG. 2A and in a section view of FIG. 2B, illustrations of the thin metal wire and the like are omitted.

Referring to FIG. 2A, the first opening portion 11A has a planar rectangular shape. The four first opening portions 11A are provided along a periphery portion of the semiconductor element 13A illustrated by dotted line in FIG. 2A. Furthermore, each of the first opening portions 11A is provided along a middle portion of a side of the semiconductor element 13A. Still furthermore, a longitudinal direction of the first opening portion 11A extends along a side direction of the semiconductor element 13A. Then, a lateral direction of the first opening portion 11A extends to the outside of the semiconductor element 13A from under the semiconductor element 13A.

The first opening portion 11A is not provided below a corner portion of the semiconductor element 13A. This is because a strong stress acts between the corner portion of the semiconductor element 12A and the conductive paste 9 and hence a connection of this point is important in performing a die bonding of the semiconductor element 13A. Accordingly, it is possible to make a bond structure of the semiconductor element 13A stronger by adhering the conductive paste 9 and the covering resin 14 to each other at this spot.

Specifically, in a region below the semiconductor element 13A, where the fist conductive pattern 12A is not provided, the conductive paste 9 and the covering resin 14 are adhered to each other firmly. Referring to FIG. 2A, the region where the conductive paste 9 and the covering resin 14 are adhered to each other firmly is illustrated as a bond region A1. Specifically, this bond region A1 extends to the central portion of the semiconductor element 13A and the corner portion thereof In other words, the bond region A1 extends to a region except for the middle portion of each side at the periphery of the semiconductor element 13A.

Referring to FIG. 2B, additional effects of the first opening portion 11A will be described. The first opening portion 11A has a function to suppress the spread of the conductive paste 9. To be concrete, a step corresponding to a thickness of the covering resin 14 can be formed by providing the first opening portion 11A. By suppressing the spread of the conductive paste 9 by this step, it is possible to prevent that the conductive paste 9 and other conductive patterns 12 are short-circuited. The spread of the conductive paste 9 is larger in the vicinity of the middle portion of the side of the semiconductor element 13A than in the corner portion thereof. Accordingly, by providing the first opening portion 11A at the point corresponding to the middle portion of the side of the semiconductor element 13A, the excessive spread of the conductive paste 9 at this middle portion can be suppressed. Furthermore, by suppressing the excessive spread of the conductive paste 9, it is also possible to make the intervals between the conductive pattern 12 connected to the semiconductor element 13A through the conductive paste 9 and other conductive patterns closer.

Figure 3:
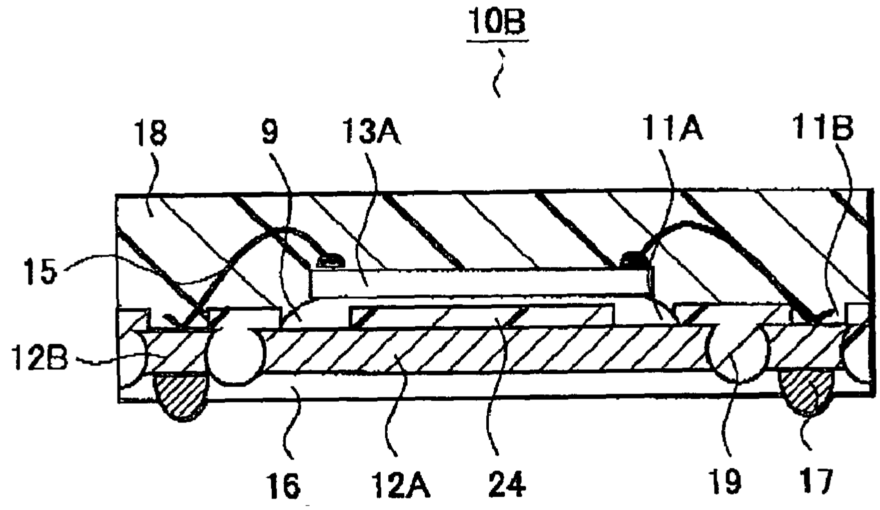
FIG. 3 is a section view showing a circuit device of the preferred embodiment.

Referring to FIG. 3, a constitution of a circuit device 10B of another embodiment will be described. A fundamental constitution of the circuit device 10B is the same as that of the semiconductor device 10A shown in FIGS. 1A and 1B, and the circuit device 10B differs from the semiconductor device 10A in that the circuit device 10B has a single-layer wiring structure. The conductive patterns 12 are isolated from each other by a covering resin 24 filled in an isolation trench 19. Then, a rear surface of the conductive pattern 12 is exposed downwardly between the covering resin 24. Other constitution of the circuit device 10B is the same as those of the circuit device 10A. The rear surface of the conductive pattern 12 is electrically connected to an external electrode 17.

Figure 4:
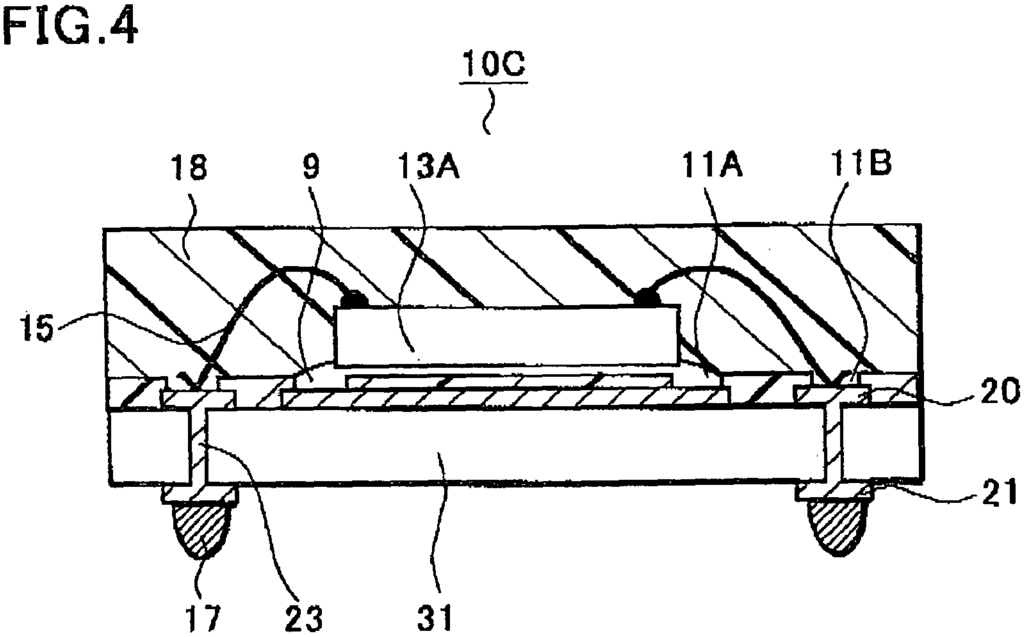
FIG. 4 is a section view showing a circuit device of the preferred embodiment.

Referring to FIG. 4, a constitution of a circuit device 10C of another embodiment will be described. A fundamental constitution of the circuit device 10C of which section view is shown in FIG. 4 is the same as that of the circuit device 10A shown in FIGS. 1A and 1B, and the circuit device 10C of this embodiment differs from the circuit device 10A in that the circuit device 10C has a supporting board 31. As this supporting board 31, a well known board including a board made of resin such as a glass epoxy resin board, a ceramic board, and a metal board can be used.

A manufacturing method of the circuit device 10A shown in FIGS. 1A and 1B will be described with reference to FIGS. 5A to 5D, FIGS. 6A to 6D, FIGS. 7A and 7B, and FIGS. 8A and 8B. First, referring to FIG. 5A, a lamination sheet in which first and second conductive foils 33 and 34 are laminated with an insulating layer 32 interposed therebetween is prepared.

Figure 5A:
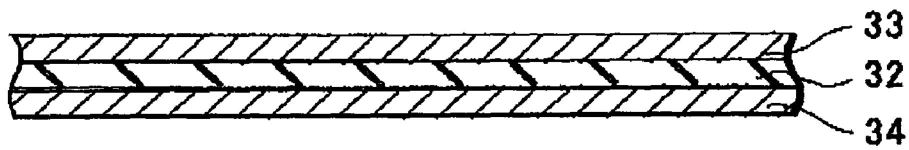
FIGS. 5A, 5B, 5C and 5D are section views showing a manufacturing method of the circuit device of the preferred embodiment.
Figure 5B:
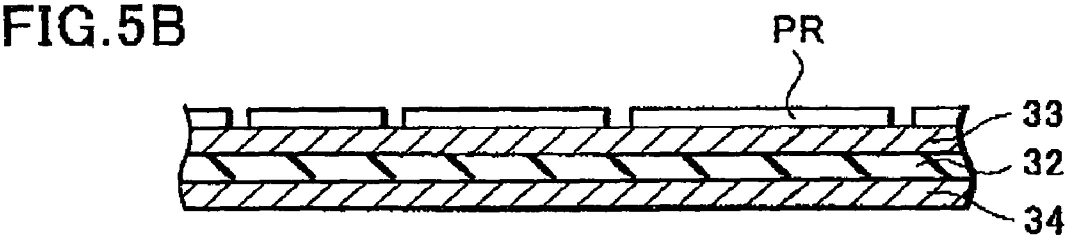

Next, referring to FIG. 5B, a resist PR is laminated on a surface of the first conductive foil 33, and patterned. To be concrete, an opening is formed at a point of the resist PR corresponding to a connection portion to be formed.

Figure 5C:
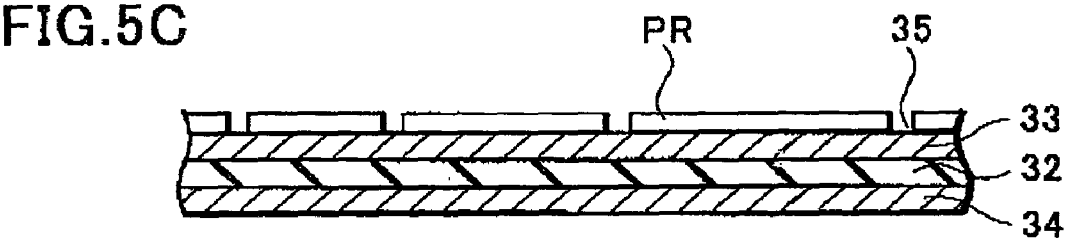

Referring to FIG. 5C, the first conductive foil 33 is etched through the patterned resist PR The first conductive foil 33 is partially removed at its region corresponding to the connection portion to be formed, and thus a through hole 35 can be formed.

Figure 5D:
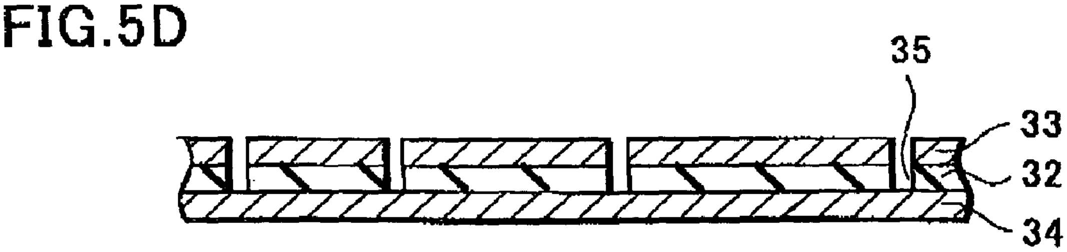

Referring to FIG. 5D, the resist PR is removed after the through hole 35 is formed. Subsequently, by removing the insulating layer 32 positioned below the through hole 35, the through hole 35 is allowed to reach a surface of the second conductive foil 34. The removal of this insulating layer 32 can be performed by use of a carbon dioxide gas laser.

Figure 6A:
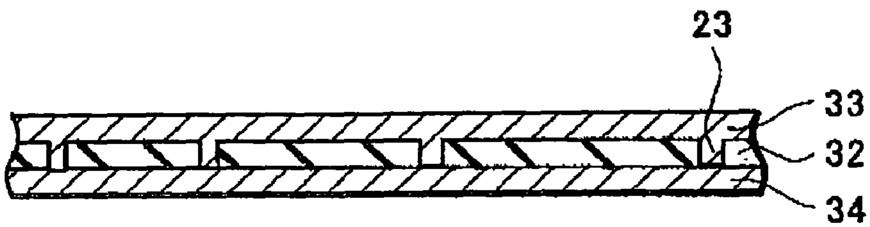
FIGS. 6A, 6B, 6C and 6D are section views showing a manufacturing method of the circuit device of the preferred embodiment.
Figure 6B:
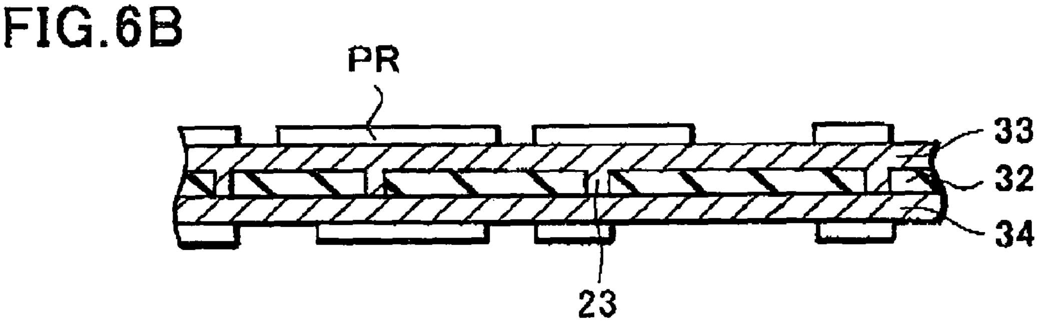

Referring to FIG. 6A, by forming a plating film made of a metal such as copper, a connection portion 23 is formed in the through hole 35, and the first and second conductive foils 33 and 34 are electrically connected. Subsequently, referring to FIG. 6B, an upper surface of the first conductive foil 33 and a lower surface of the second conductive foil 34 are covered by resists PR. Both resists PR are patterned. Furthermore, both conductive foils are etched by use of the resists PR.

Figure 6C:
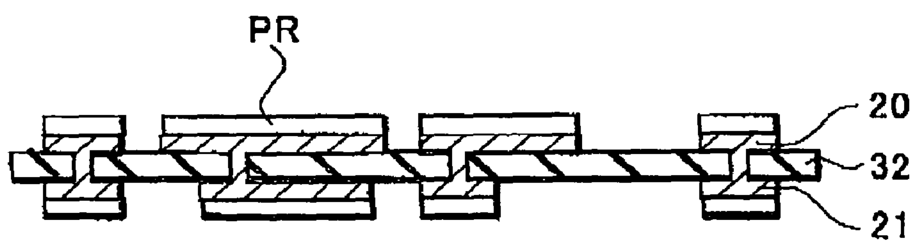
Figure 6D:
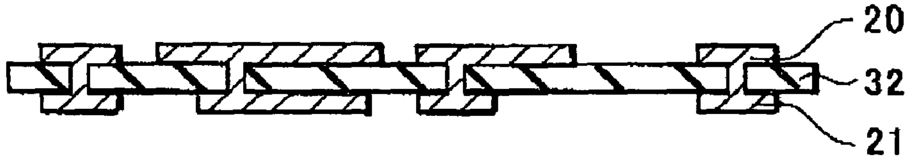

Referring to FIG. 6C, the first and second conductive foils 33 and 34 are etched by using the resist PR as an etching mask. As a result, first and second wiring layers 20 and 21 are formed. After this etching is finished, the resists PR are peeled off as shown in FIG. 6D. Then, the first wiring layer 20 is covered by a covering resin 14, and opening portions 11 are formed so that conductive patterns at desired points are exposed.

Figure 7A:
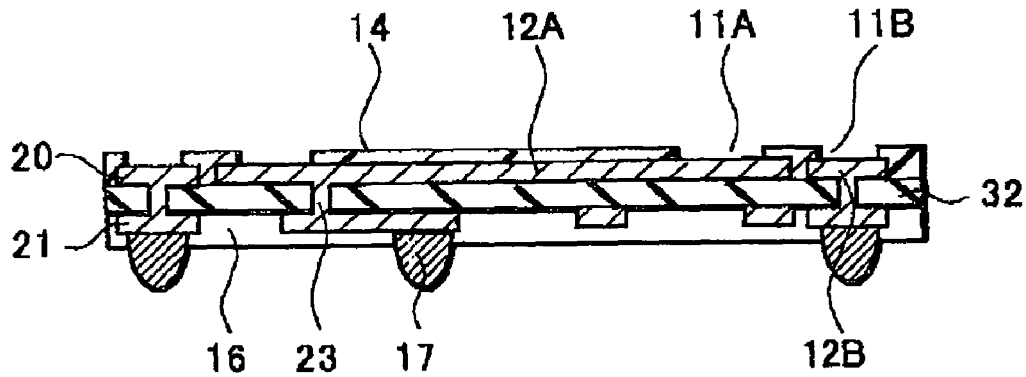
FIG. 7A is a section view showing a manufacturing method of the circuit device of the preferred embodiment and FIG. 7B is a plan view showing the manufacturing method of the circuit device of the preferred embodiment.
Figure 7B:
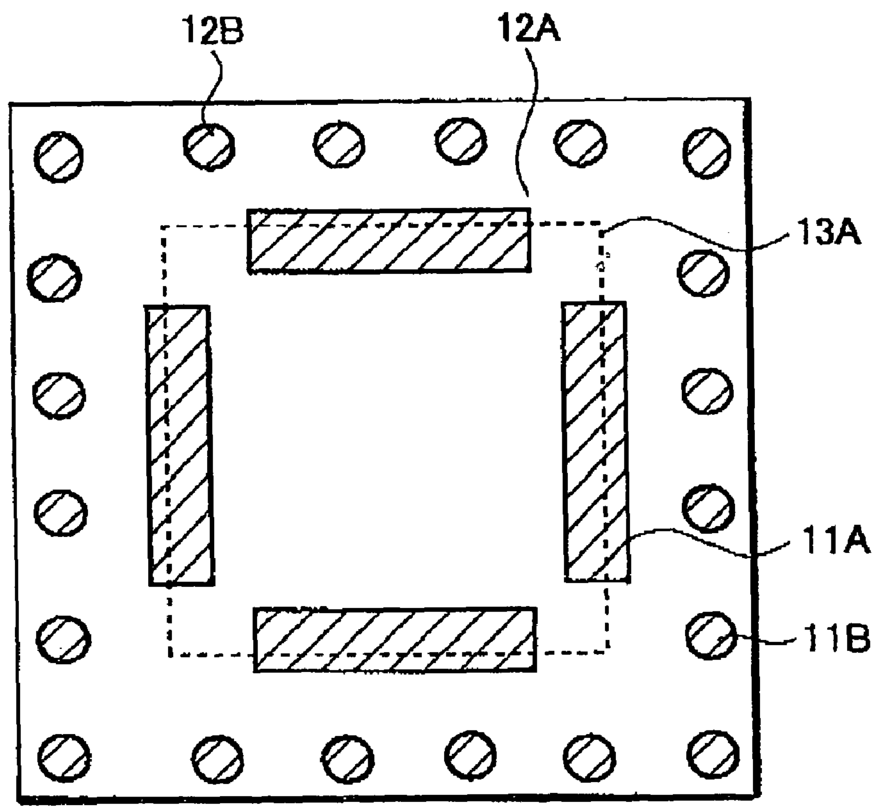

Referring to a section view of FIG. 7A and a plan view of FIG. 7B, the first opening portion 11A is formed in a periphery portion of a semiconductor element 13A to be mounted. The second opening portion 11B is formed in a region serving as a bonding pad to which a thin metal wire is to be connected. By partially removing the covering resin 14, the opening portion 11 is formed. A partial removal of the covering resin 14 can be performed by use of laser and the like. Furthermore, the partial removal of the covering resin 14 can be performed in a lithography step.

Figure 8A:
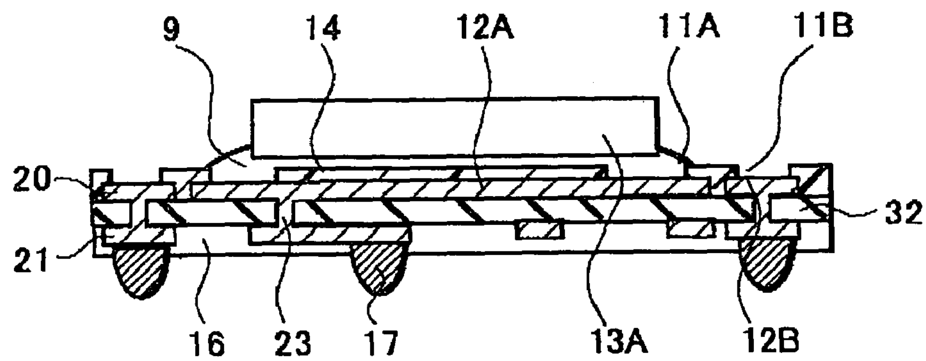
FIG. 8A is a section view showing a manufacturing method of the circuit device of the preferred embodiment.
Figure 8B:
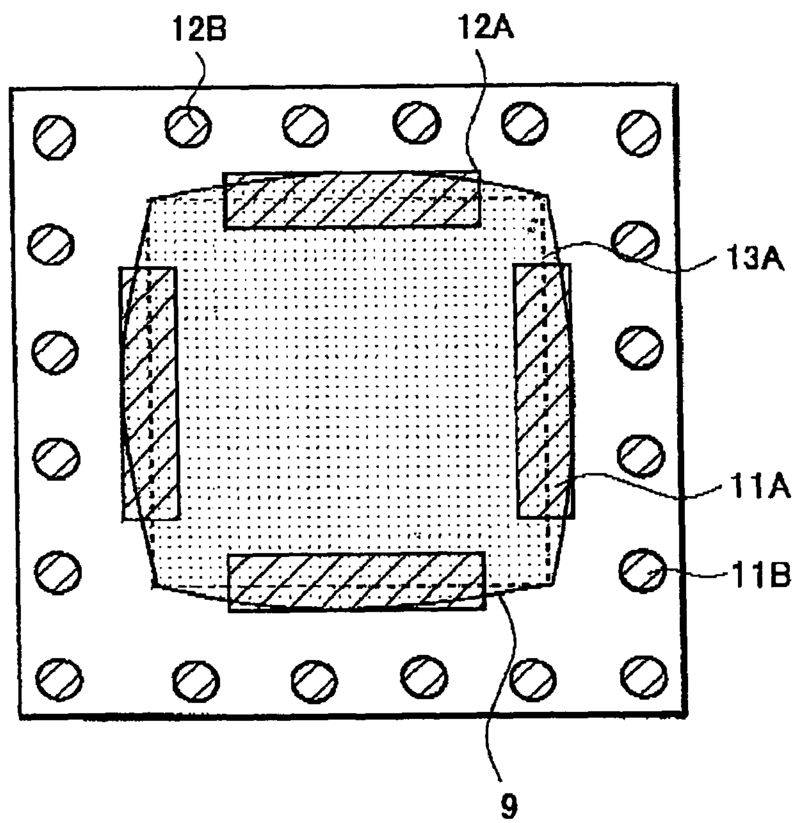
FIG. 8B is a plan view showing the manufacturing method of the circuit device of the preferred embodiment.
Figure 9A:
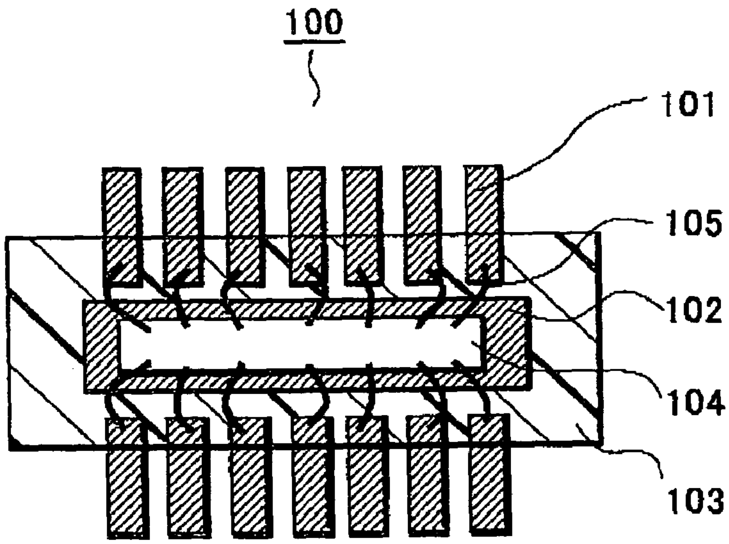
FIG. 9A is a plan view showing a conventional circuit device.
Figure 9B:
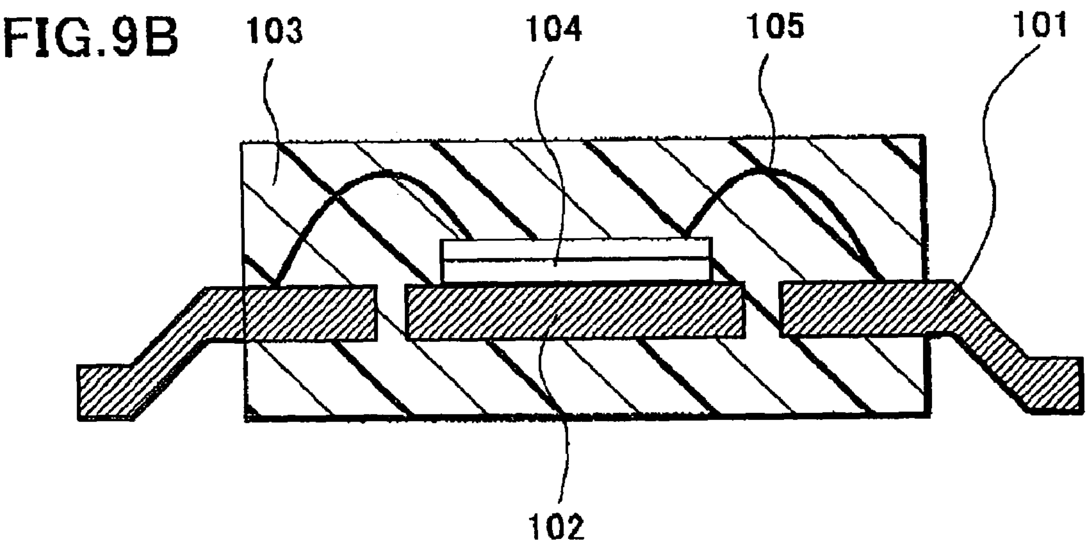
FIG. 9B is a section view showing the conventional circuit device.

Next, referring to a section view of FIG. 8A and a plan view of FIG. 8B, the semiconductor element 13A and the first conductive pattern 12A are electrically connected to each other through the conductive paste 9 interposed therebetween. In this step, the conductive paste 9 comes into contact with the first conductive pattern 12A exposed from the first opening portion 11A, whereby an electrical continuity between the rear surface of the semiconductor element 13A and the first conductive pattern 12A is provided. Then, the conductive paste 9 is adhered to the covering resin 14 firmly, whereby a bond strength of the semiconductor element 13A is increased. To be concrete, the conductive paste 9 is coated onto the upper portion of the covering resin 14, and the semiconductor element 13A is mounted on the conductive paste 9. In this step, the first opening portion 11A functions as a prevention region for preventing the excessive spread of the conductive paste 9. Accordingly, it is possible to suppress that the conductive paste 9 excessively flows out of the region indicated by the dotted line, where the semiconductor element 13A is mounted. Thus, short-circuiting of the conductive patterns 12 by the conductive paste 9 flowing out can be prevented. After the above described step, a thin metal wire 15 for connecting the semiconductor element 13A and the second conductive pattern 12B is formed, and a sealing resin 18 is formed so as to cover the semiconductor element 13A, whereby the circuit device 10A as shown in FIGS. 1A and 1B is manufactured.

Furthermore, it is possible to use insulating adhesive instead of the above described conductive paste. Also in this case, it is possible to suppress excessive spread of the insulating adhesive by an action of the first opening portion.

What is claimed is:

1. A circuit device, comprising:

a conductive pattern;

a covering resin for covering the conductive pattern except for an opening portion; and a semiconductor element electrically connected to the conductive pattern exposed from the opening portion through a conductive paste, wherein the opening portion is formed to be smaller than the semiconductor element, and the conductive paste comes into contact with both of the covering resin and the conductive pattern exposed from the opening portion.

2. The circuit device according to claim 1, wherein the conductive paste is a silver paste.

3. The circuit device according to claim 1, wherein a plating film is formed on a surface of the conductive pattern exposed from the opening portion.

4. The circuit device according to claim 1, wherein the opening portion is provided along a middle portion of each side of the semiconductor element, and a corner portion of the semiconductor element is adhered to the covering resin with the conductive paste interposed therebetween.

5. The circuit device according to claim 1, wherein a sealing resin is formed so as to seal the semiconductor element.

6. The circuit device according to claim 1, wherein the conductive pattern has a multi-layered wiring structure.

* * * * *